United States Patent
Kiyama

[11] Patent Number: 5,985,678
[45] Date of Patent: Nov. 16, 1999

[54] METHOD OF EVALUATING AND THERMALLY PROCESSING SEMICONDUCTOR WAFER

[75] Inventor: Makoto Kiyama, Hyogo, Japan

[73] Assignee: Sumitomo Electric Industries, Ltd., Osaka, Japan

[21] Appl. No.: 08/819,972

[22] Filed: Mar. 18, 1997

[30] Foreign Application Priority Data

Mar. 25, 1996 [JP] Japan .................................. 8-067763
Feb. 26, 1997 [JP] Japan .................................. 9-042351

[51] Int. Cl.⁶ .................................................. H01L 21/00
[52] U.S. Cl. .................................................. 438/5
[58] Field of Search ................... 438/5, 6, 7, 10, 438/14, 15; 378/34

[56] References Cited

U.S. PATENT DOCUMENTS 5,390,228  2/1995  Niibe et al. ........................... 378/34
5,436,172  7/1995  Moslehi .
5,497,381  3/1996  O'Donoghue et al. .

FOREIGN PATENT DOCUMENTS 58-102518   6/1983   Japan .
63-143815   6/1988   Japan .
04042945    2/1992   Japan .
08045946    2/1996   Japan .
10172977   12/1996   Japan .

OTHER PUBLICATIONS

Mokuya et al. "Characteristics of the transient wafer temperature distribution in a furnace for semiconductor fabrication process" Electronics and Communications in Japan (Part 2) Dec. 1987. vol. 70. No. 12. pp. 59–65.

Primary Examiner—Charles Bowers
Assistant Examiner—Craig Thompson
Attorney, Agent, or Firm—W. F. Fasse; W. G. Fasse

[57] ABSTRACT

In a method of evaluating a semiconductor wafer to provide an index as to whether slip generation is likely or not, the in-plane temperature distribution of the wafer is varied at a prescribed temperature and the condition of the temperature distribution at which slip line generation occurs is detected. The temperature distribution is varied using plural concentric heaters and is measured using a radiation thermometer. The temperature distribution is correlated to thermal stress in the wafer. In this manner, a range of tolerable thermal stress is specified, at which a slip line will not be generated.

17 Claims, 11 Drawing Sheets

WAFER

TEMPERATURE DISTRIBUTION

THERMAL STRESS DISTRIBUTION

METHOD OF EVALUATING AND THERMALLY PROCESSING SEMICONDUCTOR WAFER

BACKGROUND OF THE INVENTION

1. Field of the Invention

The present invention relates to a method of evaluating a semiconductor wafer (hereinafter referred to as a wafer). More specifically, the present invention relates to a method of evaluating a semiconductor wafer which can provide an index as to whether generation of a slip line is likely or not. Further, the present invention relates to a method of thermally processing the semiconductor wafer while preventing generation of a slip line, based on the data obtained by the method of evaluation. The present invention also relates to an apparatus for thermally processing the semiconductor wafer improved to prevent generation of the slip line, based on the data obtained by the method of evaluation.

2. Description of the Background Art

FIG. 1 shows steps of manufacturing a general semiconductor device. The manufacturing process of a semiconductor device includes the steps of preparing a wafer, forming an active layer on the wafer, and fabricating a device. In order to form the active layer, thermal processing, which is epitaxial growth (600–700° C.) or activation annealing (up to 800° C.) after ion implantation, are performed. The step of fabricating the device includes the steps of photolithography, forming electrodes and etching.

Now, in the aforementioned thermal processing, it is recognized that the wafer is subjected to plastic deformation and, as a result of plastic deformation, slip lines are generated on the surface of the wafer. A slip line is considered a step such as shown in FIG. 2. Such a slip line decreases production yield of the devices, presenting a significant problem.

To this date, there has never been an index as to whether generation of a slip line (hereinafter simply referred to as a slip) is likely or not in a wafer. Whether a slip is generated or not, that is, resistance to slip formation of a wafer is determined qualitatively by actually performing epitaxial growth, activation annealing and so on in individual thermal processing furnace. The slip resistance could have been found qualitatively for each thermal processing furnace. However, conditions of thermal processing differ from one furnace to another. Accordingly, it has been frequently experienced that slips are generated in a certain thermal processing furnace but not generated in another.

In other words, it has been impossible to determine slip resistance of wafers consistently and quantitatively, and the slip resistance cannot be known until the wafer actually thermally processed.

As to residual stress of a wafer, residual strain (the strain multiplied by an appropriate elastic constant is the stress) has been evaluated by a photo-elastic method. However, by this method, only an absolute value of the magnitude of the residual strain could be found, and the direction of the residual strain (that is, the direction of the residual stress) could not be determined.

As already described, a slip is considered a macroscopic step generated by formation breed of a slide which is caused by a dislocation generation and multiplication in the wafer when the stress during thermal processing exceeds the yield stress of the wafer. This may be the case in a wafer without dislocation such as a silicon (Si) wafer. The concept is basically the same in a wafer having dislocations such as Gallium Arsenide (GaAs). However, it is not known whether the dislocation which causes a slide for the first time is newly generated by the stress or an already existing dislocation that slides.

The stress during thermal processing includes thermal stress caused by temperature difference in the plane of the wafer, and dead weight stress caused by the weight of the wafer itself. More specifically, a slip may be generated when a composite stress of thermal stress and dead weight stress exceeds the yield stress of the wafer. Therefore, this yield stress may be used as an index representing slip resistance. In the following, this will be referred to as critical stress for slip defect generation.

The critical stress for slip defect generation can be found by changing the stress applied to the wafer during the process, comparing the presence or absence of actual slips and then finding the critical stress applied when the slip is generated. However, in an actual thermal processing apparatus, it has been impossible to control and change the stress applied to the wafer, and calculation of the applied stress itself has been difficult.

Generation of slips can be significantly reduced when temperature during thermal processing of the wafer is increased or decreased slowly. The reason for this is that thermal stress significantly increases during increased or decreased of temperature (temperature difference in a wafer increases), and the temperature difference in a wafer becomes smaller when the temperature is increased or decreased slowly. However, in order to increase throughput of the wafers, the speed of increasing and decreasing temperature should be as fast as possible while preventing generation of the slips.

SUMMARY OF THE INVENTION

Therefore, an object of the present invention is to provide a method of evaluating a semiconductor wafer which can provide an index as to whether generation of a slip is likely or not.

Another object of the present invention is to provide a method of thermally processing a semiconductor wafer improved to prevent generation of a slip based on the data obtained by the method of evaluation.

A still further object of the present invention is to provide an apparatus for thermally processing a semiconductor wafer improved to prevent generation of a slip.

Another object of the present invention is to provide a method of evaluating a semiconductor wafer which can determine the magnitude and the direction of residual stress of a wafer.

A still further object of the present invention is to provide a method of thermally processing a semiconductor wafer in which the magnitude and the direction of residual stress of a wafer are determined and based on the data, the wafer is processed while preventing generation of a slip.

In the method of evaluating the semiconductor wafer in accordance with a first aspect of the present invention, the temperature distribution in the plane of a semiconductor wafer is changed at a prescribed temperature, and the condition of temperature distribution which causes a slip line is detected, whereby a range of tolerable thermal stress in which a slip line is not generated is specified.

According to a preferred embodiment of the present invention, by changing the prescribed temperature variously and finding ranges of tolerable thermal stress for respective temperatures, this method finds the critical stress for slip defect generation which is a function of temperature at which the slip is not generated.

In the method of thermally processing a semiconductor wafer in accordance with a second aspect of the present invention, the range of tolerable thermal stress not generating a slip line in the semiconductor wafer is specified, and the speed of increasing or decreasing the temperature of the semiconductor wafer to be processed is controlled within the range of tolerable thermal stress.

The apparatus for thermally processing a semiconductor wafer in accordance with a third aspect of the present invention includes a susceptor supporting the semiconductor wafer, heating means for applying a temperature distribution on the semiconductor wafer, means for measuring the temperature distribution of the semiconductor wafer and means for controlling the temperature distribution.

In the method of evaluating a semiconductor wafer in accordance with a fourth aspect of the present invention, first, a semiconductor wafer to be evaluated is prepared. A certain temperature distribution is provided for the semiconductor wafer. Whether or not a slip line is generated in the semiconductor wafer is monitored. By the knowledge of the state of the temperature distribution and the knowledge of the presence or absence of the slip line, it is determined whether there is residual stress in a tangential tensile direction or residual stress in a tangential compressing direction at the peripheral portion of the semiconductor wafer.

According to the method of summary processing a semiconductor wafer in accordance with a fifth aspect of the present invention, the direction of the residual stress left in the semiconductor wafer is determined, and the semiconductor wafer is thermally processed selecting a first temperature for the peripheral portion of the semiconductor wafer and a second temperature for the central portion of the semiconductor wafer such that a stress is applied in a direction opposite to the direction of the residual stress.

The method of thermally processing a semiconductor wafer in accordance with a sixth aspect of the present invention relates to a method of thermally processing the semiconductor wafer such that stress is generated in a tangential tensile direction at the peripheral portion of the semiconductor wafer, and a semiconductor wafer having a tangential compressive stress left at the peripheral portion thereof as the wafer in this method is used.

The method of thermally processing a semiconductor wafer in accordance with a seventh aspect of the present invention involves processing the semiconductor wafer to generate a stress in a tangential compressive direction at the peripheral portion of a semiconductor wafer, and a semiconductor wafer having a tangential tensile stress left at the peripheral portion thereof is used as the wafer in this method.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor wafer is placed on a horizontal plate so as to minimize its dead weight stress, and to realize a situation in which only the thermal stress has to be considered. By using a plurality of concentrical zone heaters, the temperature distribution of the wafer is controlled and changed. Thermal stress is determined by temperature distribution. Therefore, it is possible to control or change the thermal stress. Temperature distribution of the wafer itself was measured by a radiation thermometer. It is possible to determine the thermal stress from the temperature distribution.

Embodiments of the present invention will be described with reference to the figures.

First Embodiment

Figure 3:
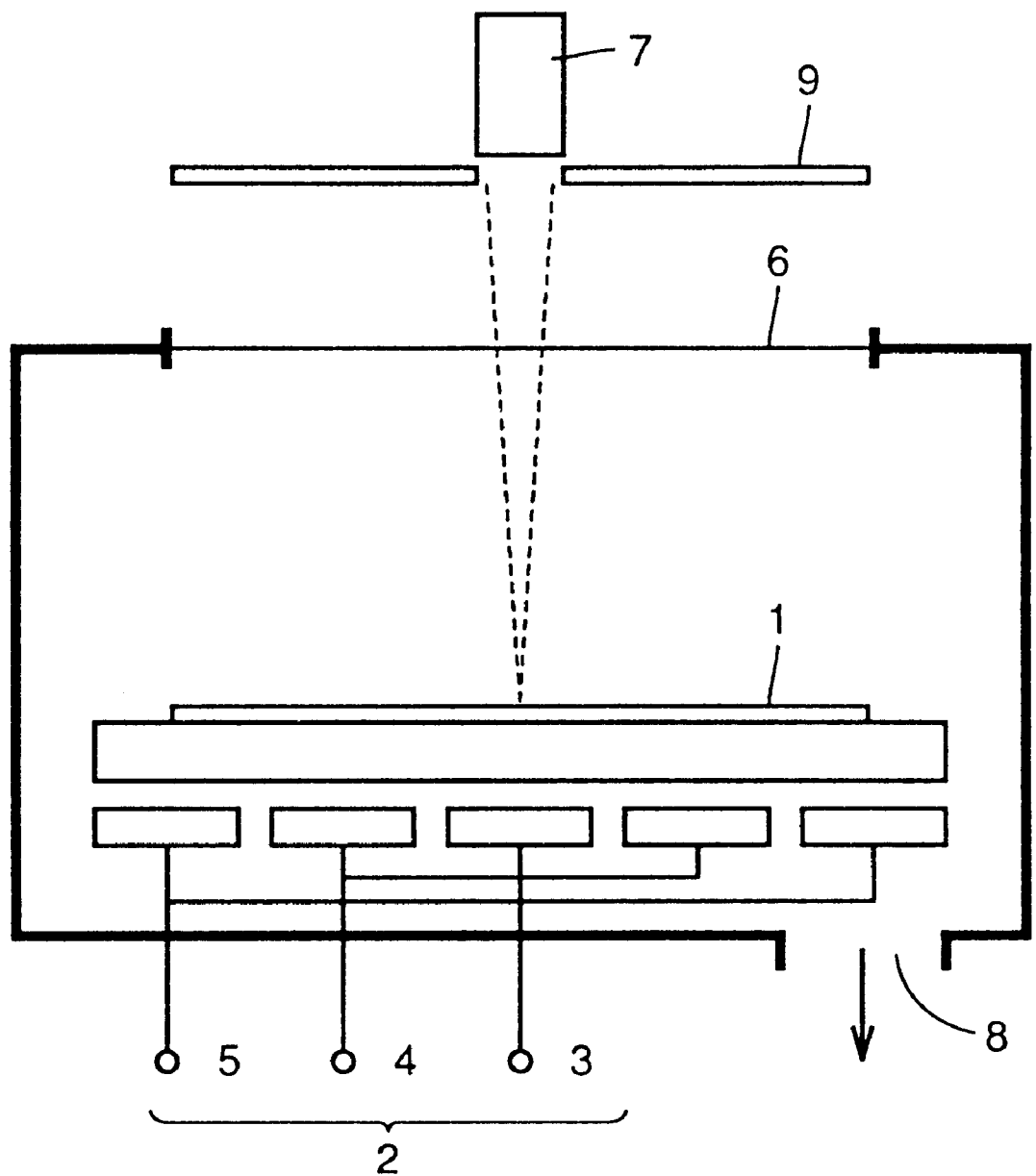
FIG. 3 shows a furnace for evaluating slips.

A furnace shown in FIG. 3 (vacuum atmosphere) was used and a GaAs wafer 1 having a diameter of 4 inches (manufactured by LEC, undoped) was evaluated. The plane orientation of wafer 1 was (001). A heater 2 used in this embodiment was a three zone heater including an inner heater 3, a middle heater 4 and an outer heater 5 made of SiC and placed concentrically relative to each other. As for the horizontal plate, a material having low thermal conductivity (of approximately the same as GaAs or lower) such as quartz, alumina, silicon nitride, SiC, zirconia or the like was adopted when a wider temperature distribution was desired, and a material having high thermal conductivity such as graphite (SiC coated), AlN or the like was adopted when a uniform temperature distribution was desired. A window 6 for measuring the wafer temperature was made of quartz.

Diameter of quartz window 6 is 100 mm and measurement of temperature is possible over the entire surface of wafer 1 having the diameter of 4 inches. By controlling and changing the power of the inner, middle and outer heaters 3, 4 and 5, various temperature distributions can be realized.

A radiation thermometer 7 for GaAs was set on a stage 9 (XY stage), the radiation thermometer 7 was moved horizontally, and the correspondence between measured temperature distribution and generation of slip was studied. A GaAs dummy wafer in which a thermocouple was buried was used to correct the temperature measured by the radiation thermometer.

Figure 4:
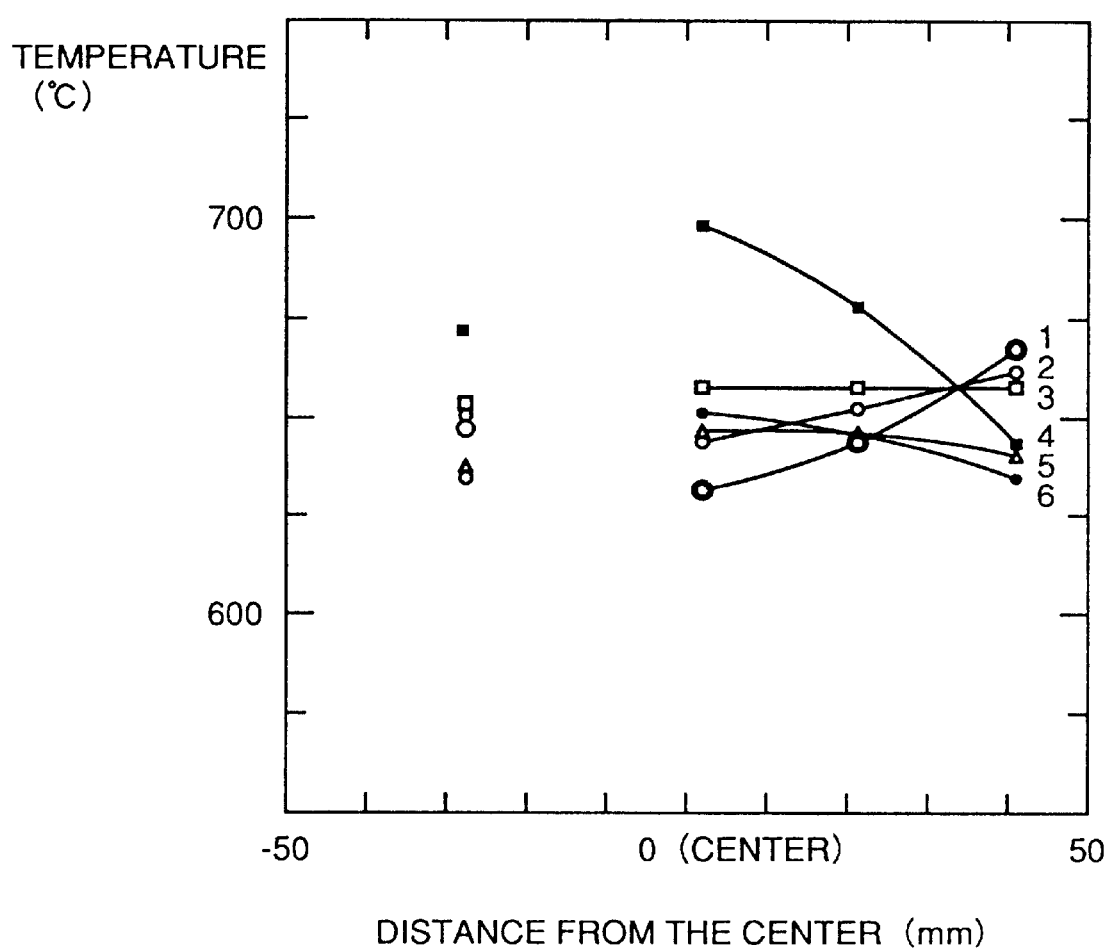
FIG. 4 is a graph showing in-plane surface temperature of a wafer.
Figure 5:
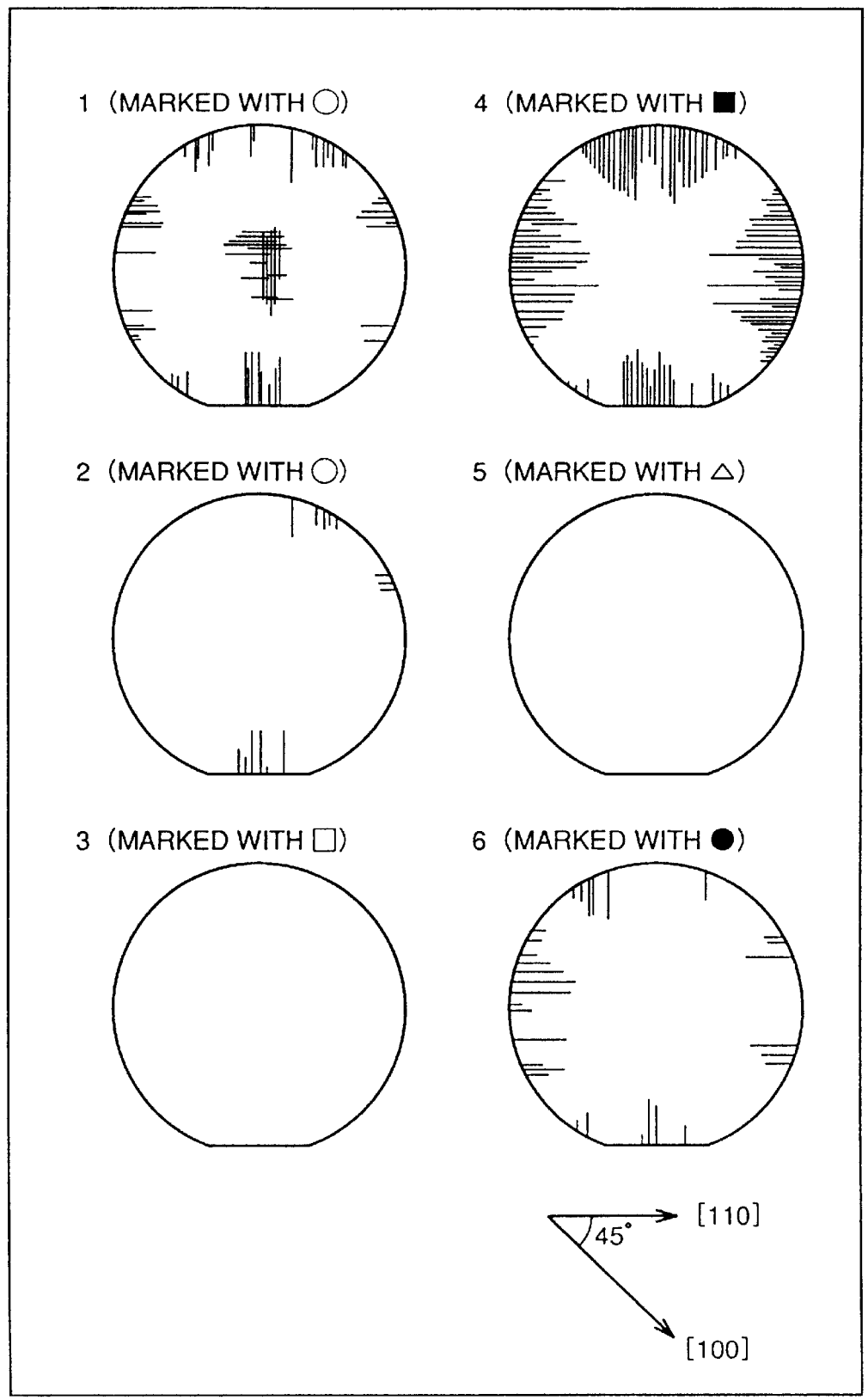
FIG. 5 includes schematic illustrations showing patterns of slip generation.

FIG. 4 shows the in-plane distribution of the temperature of the wafer, for six different examples and FIG. 5 shows corresponding slip generation patterns. Referring to FIG. 4, the in-plane distribution of temperature of the wafer can be found by plotting measured temperatures with respect to the distance from the center of the wafer. The temperature distribution well fitted a parabolic curve. The temperature was from 600 to 700° C. which corresponds to the temperature during epitaxial growth (the time of holding was 30 minutes).

FIG. 4 shows six different typical temperature distributions. More specifically, three distributions were for a situation in which a central portion of the wafer is at a high temperature and the peripheral portion is at a low temperature (hereinafter referred to as convex temperature distributions, whereby a curve 4 represents a case where in-plane temperature difference is large, a curve 6 represents a case where in-plane temperature difference is moderate, and a curve 5 represents a case where in-plane temperature difference is small. Two distributions relate to a situation in which the central portion is at a low temperature and a peripheral portion is at a high temperature (hereinafter referred to as concave temperature distributions, whereby curve 1 represents a case where in-plane temperature difference is large and a curve 2 represents a case where in-plane temperature difference is small. Another situation was a uniform temperature distribution represented by a curve 3. Slip generation patterns arising when wafers are processed with these six different temperature distributions are as shown in FIG. 5.

FIG. 5 includes illustrations of slips observed by using a Nomarski microscope of 50 times magnification ×50) traced precisely. From these illustrations, it can be seen that with a convex temperature distribution and a large in-plane temperature difference represented by curve 4, considerable slips (long and large in number) were generated. When the temperature difference is small as represented by the curve 5, generation of slips was not observed. When the temperature difference was moderate (as represented by the curve 6), slips were generated moderately. As for the concave temperature distribution, considerable slips were generated when the temperature difference was large as represented by the curve 1, while generation of slips is less conspicuous when the temperature distribution was small. Generation of slips was not observed when the temperature distribution was uniform, as represented by the curve 3.

The temperature distributions shown in FIG. 4 are distributions in steady state at the highest processing temperature. Increase or decrease of temperature was performed sufficiently slowly so that there is not a temperature difference from the conditions shown in FIG. 4.

Figure 6:
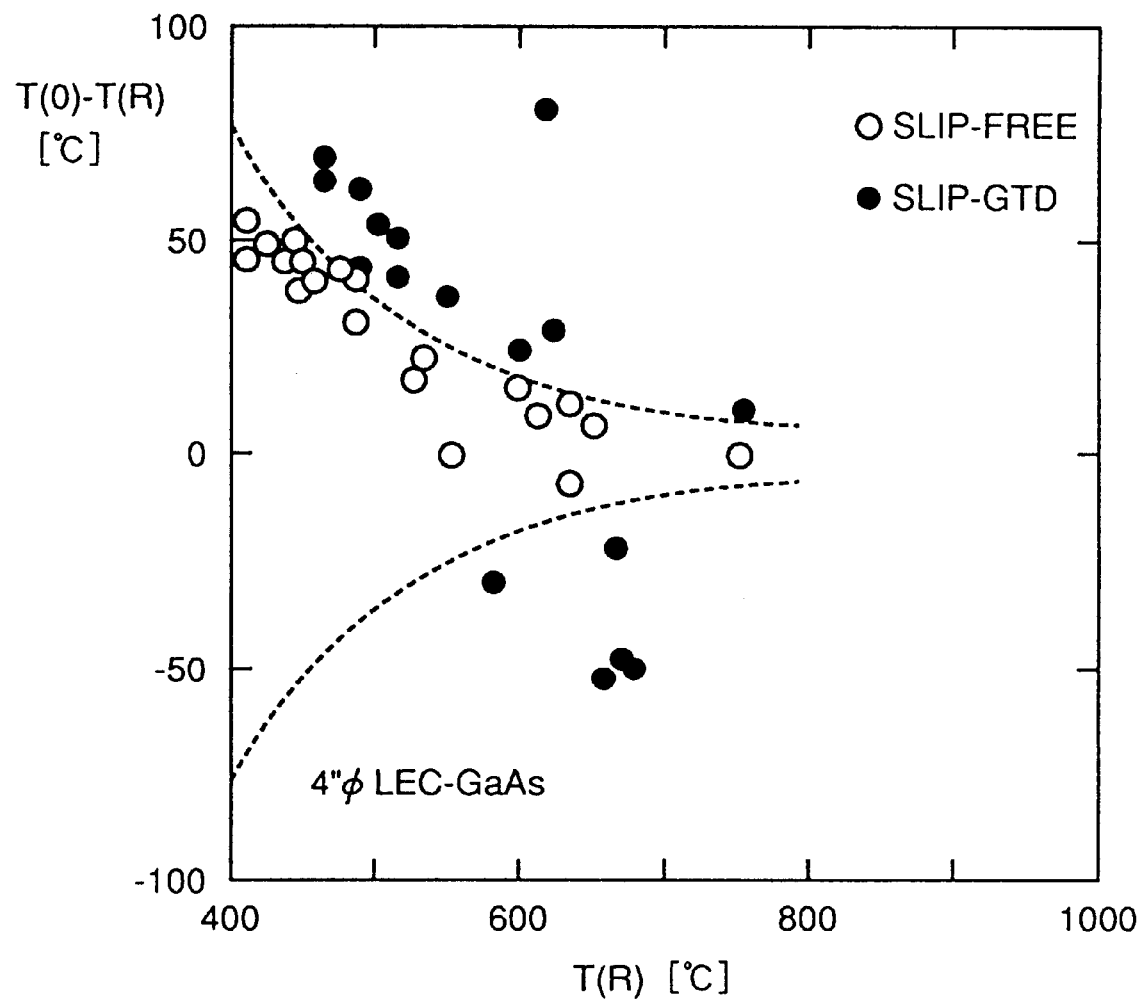
FIG. 6 is a graph showing a temperature dependence of slip generation.

Temperature dependence of slip generation will be described in the following. FIG. 6 plots applied temperature difference $T(O)-T(R)$ with respect to $T(R)$. In the expression, $T(O)$ represents temperature at the center of the wafer, while $T(R)$ represents the temperature at a wafer edge. $T(R)$ was changed from 400° C. to 750° C. In the figures, points with open circles represent experimental points where slip generation was not observed, while points with solid circles represent experimental points where slips were generated. When $T(R)$ is fixed at a certain temperature, a width a range of $T(O)-T(R)$ not causing slip generation at that temperature is the range of tolerable thermal stress not generating the slip line.

Using the data above, the method of finding the critical stress for slip defect generation will be described in the following.

As already described, the temperature distributions shown in FIG. 4 are those in the steady state at the highest processing temperature. The temperature was increased sufficiently slowly and decreased sufficiently slowly so that there was no other temperature difference than the conditions shown in FIG. 4. Therefore, highest thermal stress applied to the wafer was the thermal stress applied by the temperature distributions. It is considered that slips are generated when the maximum thermal stress exceeds the yield stress of the wafer, and slips are not generated if the maximum thermal stress is not higher than the yield stress. Using the measured data shown in FIG. 6, the critical stress for slip defect generation was found on the condition that "slip is generated when thermal stress>yield stress." The method of finding critical stress for slip defect generation will be described.

Slips are generated starting from the peripheral portion of the wafer as can be seen from the slip patterns of FIG. 5, since thermal stress is maximum at the periphery of the wafer. The thermal stress here means thermal stress $\sigma\theta(R)$ of a tangential direction at a wafer edge which is a cause of slip generation, and which can be represented by the following equation assuming that the temperature distribution is a parabolic curve. Let us consider a r-θ circular coordinate with the wafer center being O and wafer edge being R.

$$\sigma\theta(R)=\alpha(T(O)-T(R))/2 \tag{1}$$

$\sigma\theta(R)$: thermal stress in tangential direction at a wafer edge

α: thermal expansion coefficient

E: Young's modulus

The temperature distributions shown in FIG. 4 were fitted in parabolic curves and $\sigma\theta(R)$ was derived using the expression (1) above.

The expression (1) will be described in the following. Let us consider thermal stress when a parabolic convex temperature distribution $(T(O)-T(R)>0)$ such as shown in FIG. 7(b) was applied. What is necessary is to consider thermal stress σr in the direction r and thermal stress σθ in the direction θ, in the r-θ circular coordinate. Here, σr and σθ are referred to the principal stresses.

Figure 7A:
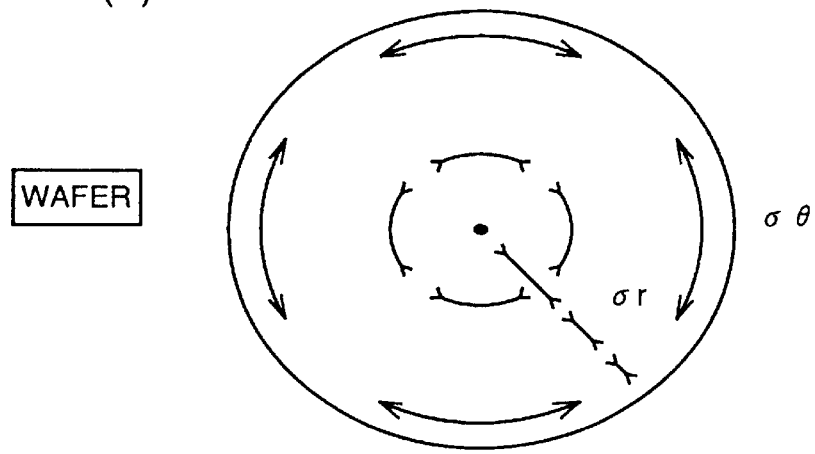
FIGS. 7(a)–7(c) show analysis of thermal stress.
Figure 7B:
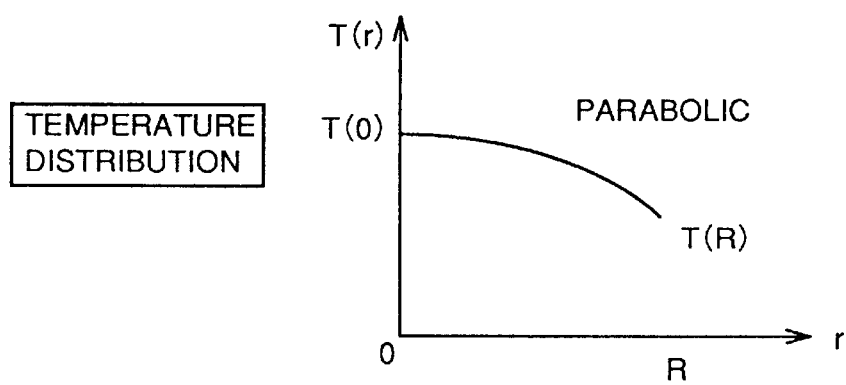
Figure 7C:
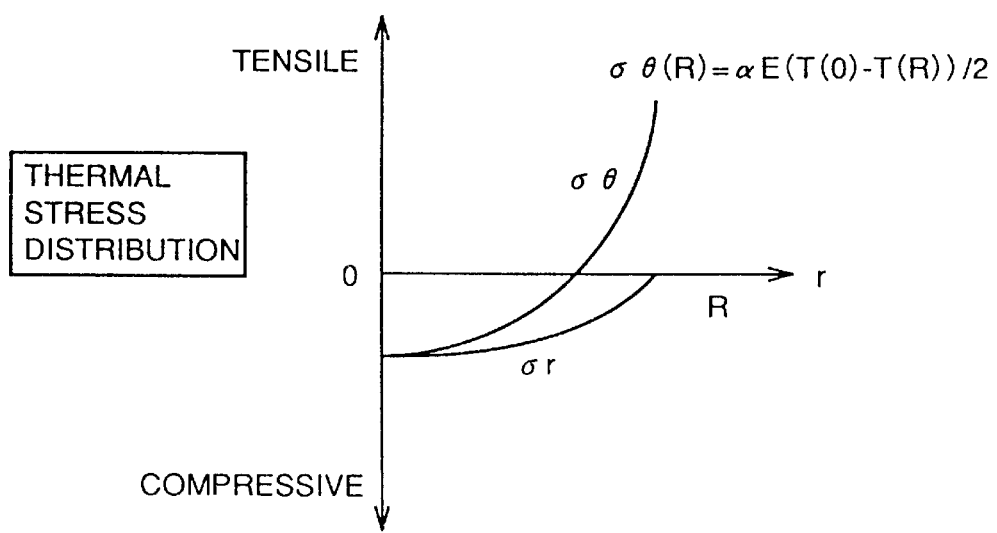

The principal stresses σr and σθ are as shown in FIG. 7(c). Namely, σr is compression stress in the entire region in the wafer plane (when the sign of the stress is +, it represents tensile stress, while the sign − represents compression stress). The absolute value of σr is maximum at the wafer center r=0, and it is 0 at wafer edge r=R. It can be seen from the sign of σθ that there is compression stress at the center of the wafer, the stress changes from compression stress to tensile stress near the middle portion and maximum tensile stress is attained at the wafer edge r=R.

FIG. 7(a) shows images of magnitude and direction of σr and σθ. The maximum value of thermal stress on the entire surface of the wafer is the tensile thermal stress $\sigma\theta (R)$ in the direction of θ at the wafer edge, and because of this stress, slips are generated from the wafer edge. If the temperature distribution is the concave temperature distribution opposite to FIG. 7(b) $(T(O)-T(R)<0)$, directions of σr and σθ are reversed, the maximum value of thermal stress on the entire surface of the wafer is the compression thermal stress of $\sigma\theta(R)$, which generates slips.

Figure 8:
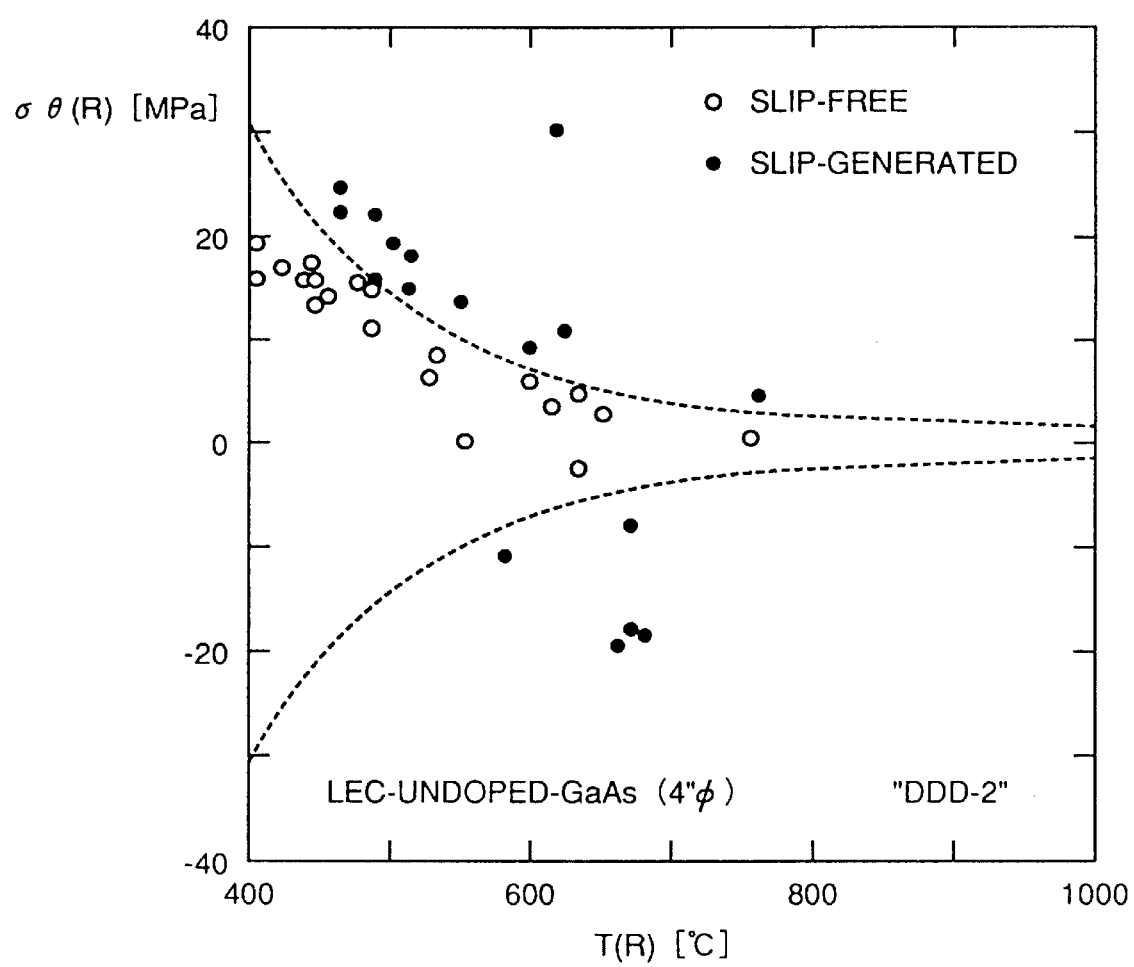
FIG. 8 shows a relation between maximum thermal stress ($\sigma\theta R$) and temperature (T(R)).

The method of determining the critical stress for slip defect generation will be described in the following. The critical stress for slip defect generation is considered as a function of temperature. Therefore, as shown in FIG. 8, the maximum thermal stress $\sigma\theta(R)$ was plotted with respect to the temperature $T(R)$ at the wafer edge where slips are generated. When the value $\sigma\theta(R)$ has the sign +, it represents a tensile stress (corresponding to convex temperature distribution) and if $\sigma\theta(R)$ has the sign −, it represents compression stress (corresponding to concave temperature distribution). open circles represent temperature distribution conditions where slips are not generated, while solid circles show conditions of temperature distribution where slips were generated.

A boundary between open and solid circles corresponds to the critical stress for slip defect generation which well fitted 0.046 exp (0.38 eV/kT)[MPa] as represented by the dotted line in FIG. 8, where k represents a Boltzman constant and T the absolute temperature. For example, at the temperature of 450° C., the critical stress for slip defect generation is about 20 MPa. It was found that the higher the temperature, the smaller the critical stress for slip defect generation, which was about 7 MPa at the temperature of 600° C. and about 3 MPa at the temperature of 800° C. Namely, the higher the temperature, the more likely the slip generation.

As for the values of thermal expansion coefficient α and Young's modulus E necessary for obtaining σθ(R), the following values were used taking temperature dependence into consideration.

The value α was determined in accordance with the following equation, which was disclosed in A. S. Jordan, Journal of Crystal Growth 49 (1980) 631.

$$\alpha[K^{-1}]=4.68E-6+3.82E-9\ T$$

In the above equation, T represents absolute temperature. As for the value E, a value was used for the <210> or <120> direction where slip generation is likely, taking anisotropy of the crystal into consideration. These directions are represented as $\theta m=\pi/8(1+2n)$[rad](n: integer) where the direction [100] corresponds to $\theta=0$. As can be seen from FIG. 5, actually, slips were generated with priority in such direction. Though not described in detail, the reason is as follows. The slide system for GaAs crystal is, <110>/{111} (the crystal slides in the direction of <110> in {111} plane), and resolved shear stress with respect to such slide system of the maximum applied thermal stress σθ(R) for a (001) wafer (stress in the slide direction acting on the slide surface) attains the maximum when $\theta=0$ m.

The value E in the direction <210> or <120> was calculated in accordance with the following equation.

$$1/E=S_{11}-2(S_{11}-S_{12}-\tfrac{1}{2}S_{44})(\sin \pi/8 \cdot \cos \pi/8)^2 \quad (2)$$

where $S_{11}$, $S_{12}$, and $S_{44}$ represent elastic compliances.

$$S_{11}=(C_{11}+C_{12})/(C_{11}-C_{12})/C_{11}+2C_{12})$$

$$S_{12}=-C_{12}/(C_{11}-C_{12})/(C_{11}+2C_{12})$$

$$S_{44}=1/C_{44} \quad (3)$$

Elastic compliances are related to elastic stiffnesses $C_{11}$, $C_{12}$ and $C_{44}$. Values of $C_{11}$, $C_{12}$ and $C_{44}$ defined by the following equations disclosed in the aforementioned article were used.

$$C_{11}[Pa]=12.16E10-1.39E7\ T$$

$$C_{12}[Pa]=5.43E10-5.76E6\ T$$

$$C_{44}[Pa]=6.18E10-7.01E6\ T \quad (4)$$

More specifically, Young's modulus E calculated in accordance with equations (2) to (4) above was used.

In the method described above, the presence or absence of a slip is observed by a microscope using one wafer for one temperature distribution. In order to find critical stress for slip defect generation, it is necessary to prepare several wafers having similar characteristics (adjacent wafer) and to test the wafers with several different temperature distributions.

By developing this method, utilizing laser reflection and observing generation of slip at the site (hereinafter referred to as site observation), it is possible to find the critical stress for slip defect generation by using only one wafer. Specific method will be described in the following.

The wafer temperature is increased under such a condition that the in-plane temperature of the wafer is uniform. A peripheral portion of the wafer is irradiated with a laser, and reflected light is detected by a photo detector. Thereafter, the temperature distribution of the wafer is increased slowly. When the maximum thermal stress σθ(R) derived from the temperature distribution exceeds the critical stress for slip defect generation, a slip is generated, and at that moment, a warp condition of the wafer changes, and hence the direction of reflected laser light changes. When the direction of the laser and the photo detector are adjusted such that the intensity of laser reflected light attains a maximum before slip generation, the detected intensity of laser reduces at the very moment of slip generation. Therefore, the moment of slip generation can be detected. The value σθ(R) calculated from the temperature distribution at that time is the critical stress for slip defect generation.

Second Embodiment

Figure 9:
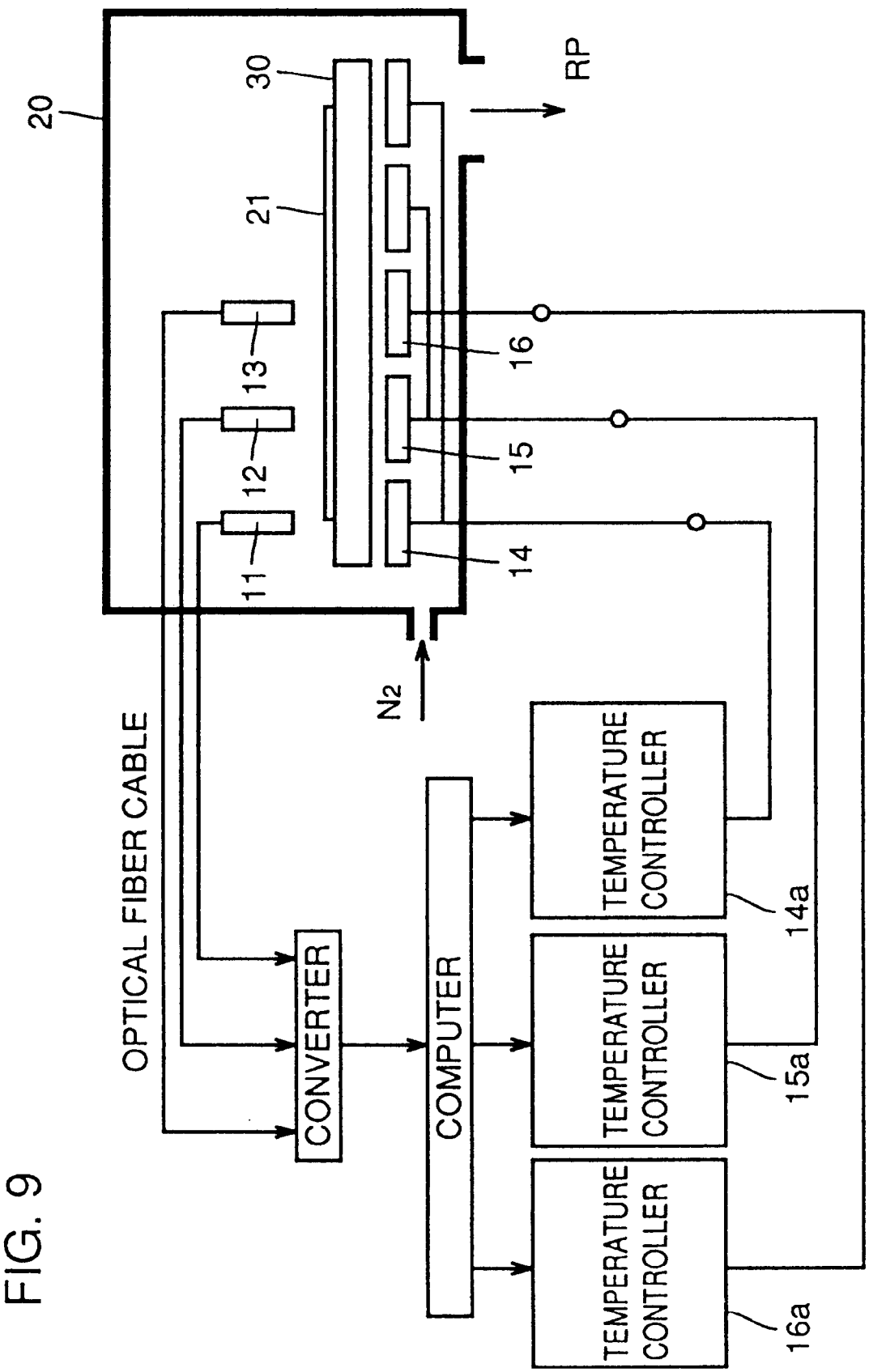
FIG. 9 shows a concept of a thermal processing apparatus realizing thermal processing without slip generation.

A thermal processing apparatus such as shown in FIG. 9 for realizing thermal processing without slip generation based on the data of FIG. 8 was fabricated. The thermal processing apparatus includes a thermal processing furnace 20 having a susceptor 30. The apparatus shown in FIG. 9 differs from the apparatus of FIG. 3 in the following points. Namely, a light collecting portion (outer light collecting portion 11, middle light collecting portion 12 and inner light collecting portion 13) which is a part of a fiber type radiation thermometer is introduced in a chamber 20 to measure temperature distribution of wafer 21, and in-plane temperature distribution of the wafer is controlled at respective temperatures such that the in-plane maximum thermal stress calculated from the data of temperature distribution does not exceed the critical stress for slip defect generation shown in FIG. 8. More specifically, above wafer 21 at positions corresponding to three zone heaters (outer heater 14, middle heater 15 and inner heater 16), light collecting portions 11, 12 and 13 of fiber type radiation thermometer are provided. Temperatures measured at respective positions are input to a computer and the temperature the distribution of the wafer and the maximum thermal stress σθ(R) in the plane of the wafer were calculated. Temperatures of respective heaters were adjusted by controllers 14a, 15a and 16a by a computer so that σθ(R) did not exceed the critical stress for slip defect generation of FIG. 8, that is, 0.046 exp(0.38 eV/kT)MPa. For example, when the wafer is cooled, the outer peripheral portion of the wafer will tend to cool more quickly and thus be at a lower temperature. Therefore, outer heater 14 is controlled to have higher power than the inner heater 16 so that the in-plane temperature distribution is made uniform. A GaAs wafer 21 having the diameter of 4 inches (manufactured by LEC, undoped) was processed in the thermal processing furnace 20 and slip generation was not observed.

The data shown in FIG. 8 represents the characteristic inherent to undoped GaAs crystal, which is not dependent on the structure of the thermal processing furnace, method of control or the like. No matter what thermal processing is performed, slip generation can be prevented in undoped GaAs wafer when the method of measuring temperature distribution and the method of control described in the second embodiment of the present invention are adopted. Though the second embodiment relates to a GaAs wafer 21 having the diameter of 4 inches, the data of FIG. 8 does not depend on the size of the wafer. The data represents characteristics inherent to GaAs crystal. Therefore, if the temperature distribution is controlled based on the data of FIG. 8, slip generation is prevented and thermal processing with high throughput is possible of wafers of a size other than the 4 inch diameter. Further, when temperature dependence of critical stress for slip defect generation is measured in the similar manner as in the first embodiment, and the temperature distribution is measured and controlled in the similar manner as the second embodiment, it is possible to thermally process GaAs wafer doped with an impurity such as Si or Zn as well as wafers of other materials (Si, InP or the like) with high throughput without slip generation.

Third Embodiment

Figure 10:
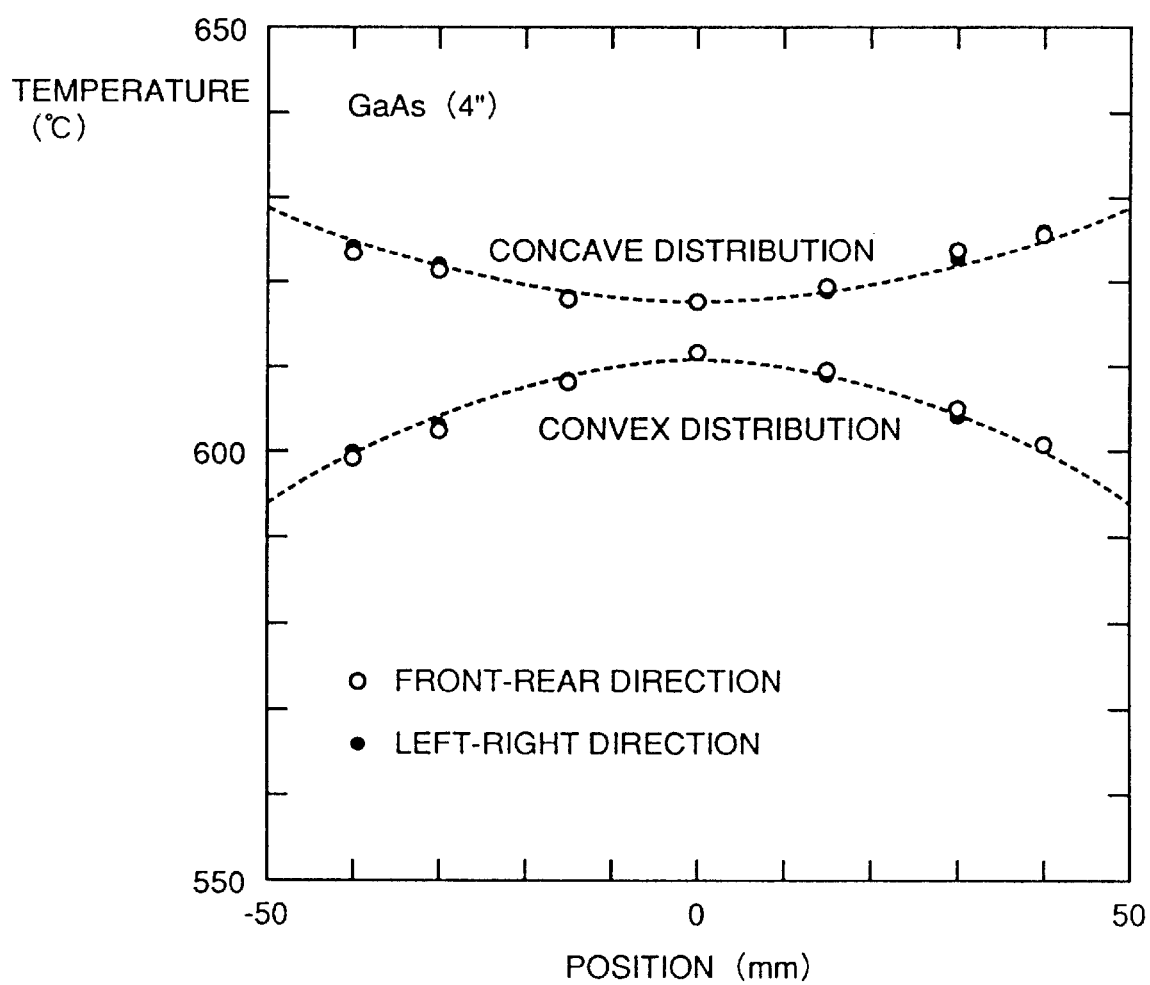
FIG. 10 shows an in-plane temperature distribution of a wafer.

Two of GaAs wafers having a diameter of 4 inches (manufactured by LEC method, undoped), one having low residual strain and the other having high residual strain, were thermally processed with convex and concave temperature distributions such as shown in FIG. 10. With the convex temperature distribution, the tensile thermal stress of $\sigma\theta(R)=$ 6.1 MPa at $T(R)=594°$ C. was generated. With the concave temperature distribution, the compression thermal stress of $\sigma\theta(R)=-4.6$ MPa at $T(R)=629°$ C. was generated. The residual strain was measured by the photo-elastic method. In the wafer with high residual strain, the in-plane average value of residual strain $|Sr-S\theta|$ was 1.2E-5, and the value of residual strain at the wafer edge which was related to slip generation was at least 2E-5. Here, Sr represents strain in the direction r in r-θ coordinates, while Sθ represents strain in the direction θ. According to the photo elastic method, the residual strain could be found only in terms of the absolute value of Sr-Sθ, and the direction of the strain could not be known. In the wafer with low residual strain, the in-plane average value of $|Sr-S\theta|$ was 0.4E-5, and residual strain at the wafer edge was at most 1E-5.

Figure 11:
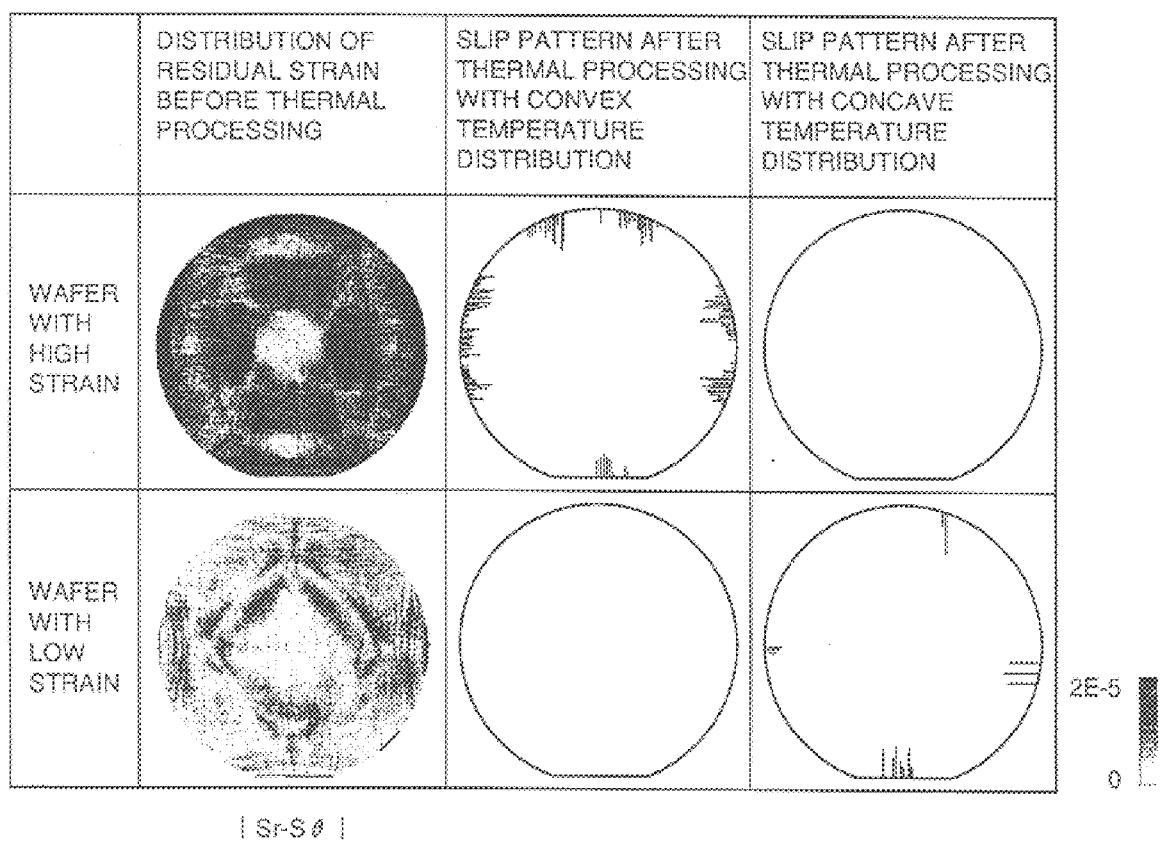
FIG. 11 shows residual strain patterns before thermal processing and slip generation patterns, especially, in the figures in the left column the degree of the residual strain is illustrated with the aid of light and shade.

Referring to FIG. 11, when thermal processing was performed with a convex temperature distribution, a large number of slips were generated in the wafer with high residual strain, while slip was not generated in the wafer with low residual strain. When thermal processing was performed with a concave temperature distribution, slip was not generated in the wafer with high residual strain while slips were generated in the wafer with low residual strain. The reason for this may be the following.

The residual stress (residual strain) at the outer peripheral portion of the wafer with high residual strain is tensile stress. Namely, when the wafer with high residual strain was thermally processed with the convex temperature distribution, the value of stress received by the wafer (crystal) is increased as the residual stress is added to the applied tensile thermal stress, making slip generation more likely as compared with the wafer with low residual strain. By contrast, when it is thermally processed with the concave thermal distribution, the residual stress was offset by the thermal stress, making slip generation less likely as compared with the wafer having low residual strain.

More specifically, according to the present invention, it becomes possible to find the direction of residual stress of the wafer which could not be found conventionally. Further, as the direction of the residual strain of the wafer can be known, the generation of slips can be suppressed by applying a stress in the direction opposite to the direction of the residual stress to the wafer during thermal processing.

Specifically, when the wafer is thermally processed, the temperature distribution of the wafer should be adjusted such that if residual stress of the wafer is in the compression direction, then a tensile stress is applied and if the residual stress of the wafer is in the tensile direction, then a compression stress is applied, whereby generation of slips can be suppressed.

Determination of the direction of residual stress of the wafer in this manner also provides the following advantage. Namely, in the method of thermally processing a wafer, when a wafer having residual stress in the direction opposite to the direction of maximum thermal stress during the thermal processing is used, generation of slips can be suppressed. More specifically, if the maximum thermal stress during thermal processing is in the tensile direction, a wafer having residual stress in the compression direction should be used and if the maximum thermal stress during thermal processing is in the compression direction, a wafer having residual stress in the tensile direction should be used, to prevent generation of slips.

Though the concentrical heater including three stages of heaters, that is, inner, middle and outer heaters was used in the above described embodiment, the invention is not limited thereto. Minimum number of stages necessary for the present invention is two, that is, one heating the edge of the wafer and one heating the center of the wafer, regardless of the wafer size. The maximum value of possible number of heater stages is about R/10, assuming that the radius of the wafer is Rmm and the minimum length necessary for one stage of heater is 10 mm. For example, the number of stages is 5 for an 4 inch wafer and 15 for a wafer having the diameter of 300 mm.

More specifically, the number of stages of the heater used in the present invention is generally represented as (2~R/10). In the first and second embodiments, three stages of heaters (max 4 inch diameter) were used taking economy and controllability into consideration. In the future, it may be possible to use the stages the number of which is close to R/10. For example, by increasing the number of stages of the heater in a wafer thermal processing furnace in which the temperature of the wafer is measured at the site, and controlled at the site, and the wafer is thermally processed while preventing generation of slip, rapid heating and rapid cooling would be possible, resulting in economical advantages.

As described above, according to the present invention, slip resistance of a semiconductor wafer which could conventionally be found only qualitatively can now be found quantitatively in terms of the critical stress for slip defect generation. Therefore, it becomes possible, to guarantee a slip-free wafer and feedback to realize wafer manufacturing in which slip generation is less likely is possible.

Further, by controlling the temperature based on the data of temperature dependence of the critical stress for slip defect generation, thermal processing without slip generation and high throughput becomes possible.

Further, the direction of residual stress of the wafer, which could not be measured conventionally, can now be found. This information can be fed back to be used during crystal manufacturing and the like (including crystal growth and thermal processing after growth). Further, in the method of thermally processing the wafer, by using a wafer having residual stress in the direction opposite to the direction of the maximum thermal stress experienced in the thermal processing of the wafer, generation of the slip can be significantly reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of evaluating a semiconductor wafer, comprising the following steps:
   a) individually heating plural areas of said wafer so as to establish an in-plane temperature distribution of respective temperatures of said areas over a plane of said wafer;
   b) varying said individual heating of said plural areas so as to change said in-plane temperature distribution at a first prescribed reference temperature of said wafer;
   c) detecting whether a slip line has been generated in said wafer during said varying; and
   d) monitoring said in-plane temperature distribution during said varying, and identifying a tolerable range of said in-plane temperature distribution for which a generation of a slip line is not detected in said step c).

2. The method according to claim 1, wherein said step d) further includes detecting a particular limit condition of said in-plane temperature distribution at which said generation of said slip line is detected, and wherein said tolerable range of said in-plane temperature distribution is identified to exclude and be bounded by said particular limit condition.

3. The method according to claim 1, further comprising a step of correlating said in-plane temperature distribution to a thermal stress state of said wafer, and based on said correlating, determining from said tolerable range of said in-plane temperature distribution a tolerable range of thermal stress in said wafer for which a slip line will not be generated.

4. The method according to claim 3, wherein said tolerable range of thermal stress is limited by and excludes a thermal stress exceeding a yield stress of the semiconductor material of said wafer.

5. The method according to claim 1, wherein said step of heating said plural areas of said wafer is carried out using plural independently controllable heaters.

6. The method according to claim 5, wherein a first one of said heaters heats a first one of said areas which is located at a peripheral edge of said wafer, and a second one of said heaters heats a second one of said areas which is located at a center of said wafer.

7. The method according to claim 6, wherein said first heater surrounds said second heater and said first area surrounds said second area.

8. The method according to claim 5, using a total number of said heaters in a range from three to the quotient of a radius of said wafer in millimeters divided by 10.

9. The method according to claim 1, wherein one of said areas is a circular area at a center of said wafer and each further one of said areas is an annular area arranged concentrically around said circular area.

10. The method according to claim 1, further comprising repeating said steps a), b), c) and d) at subsequent prescribed reference temperatures of said wafer rather than at said first prescribed reference temperature, wherein said subsequent prescribed reference temperatures are different from each other and from said first prescribed reference temperature, and further comprising determining a tolerable field of said in-plane temperature distribution for which a generation of a slip line is not detected in said step c) as a function of said prescribed reference temperature based on respective ones of said tolerable ranges of said in-plane temperature distribution identified respectively for said respective prescribed reference temperatures.

11. The method according to claim 10, further comprising a step of correlating said respective in-plane temperature distributions at said respective prescribed reference temperatures to thermal stress states of said wafer, and based on said correlating, determining from said tolerable field of said in-plane temperature distribution a tolerable field of thermal stress in said wafer for which a slip line will not be generated as a function of said prescribed reference temperature.

12. The method according to claim 11, wherein said semiconductor wafer consists essentially of undoped GaAs, and wherein said tolerable field of thermal stress is bounded by curves defined by $0.046 \exp(0.38 \text{ eV}/kT)$ MPa, wherein $k$ is Boltzman's constant and $T$ is said prescribed reference temperature in absolute terms.

13. The method according to claim 10, wherein each said prescribed reference temperature is a temperature of a selected reference one of said areas of said wafer during a respective repetition of said steps a), b), c) and d).

14. The method according to claim 1, wherein said step c) of detecting whether a slip line has been generated in said wafer comprises detecting whether a surface of said wafer has undergone a change in shape.

15. The method according to claim 14, wherein said step of detecting whether said surface of said wafer has undergone a change in shape comprises directing a laser beam at said surface and detecting light reflected from said surface.

16. The method according to claim 14, wherein said step of detecting whether said surface of said wafer has undergone a change in shape comprises observing said surface with a microscope.

17. The method according to claim 14, further comprising:
   repeating said steps a), b), c) and d) at subsequent prescribed reference temperatures of said wafer rather than at said first prescribed reference temperature, wherein said subsequent prescribed reference temperatures are different from each other and from said first prescribed reference temperature;
   determining a tolerable field of said in-plane temperature distribution for which a generation of a slip line is not detected in said step c) as a function of said prescribed reference temperature, based on respective ones of said tolerable ranges of said in-plane temperature distribution identified respectively for said respective prescribed reference temperatures;
   correlating said respective in-plane temperature distributions at said respective prescribed reference temperatures to thermal stress states of said wafer; and
   based on said correlating, determining from said tolerable field of said in-plane temperature distribution a tolerable field of thermal stress in said wafer for which a slip line will not be generated, as a function of said prescribed reference temperature.

* * * * *

UNITED STATES PATENT AND TRADEMARK OFFICE
CERTIFICATE OF CORRECTION

PATENT NO. : 5,985,678
DATED : November 16, 1999
INVENTOR(S) : Makoto Kiyama

Figure 1:
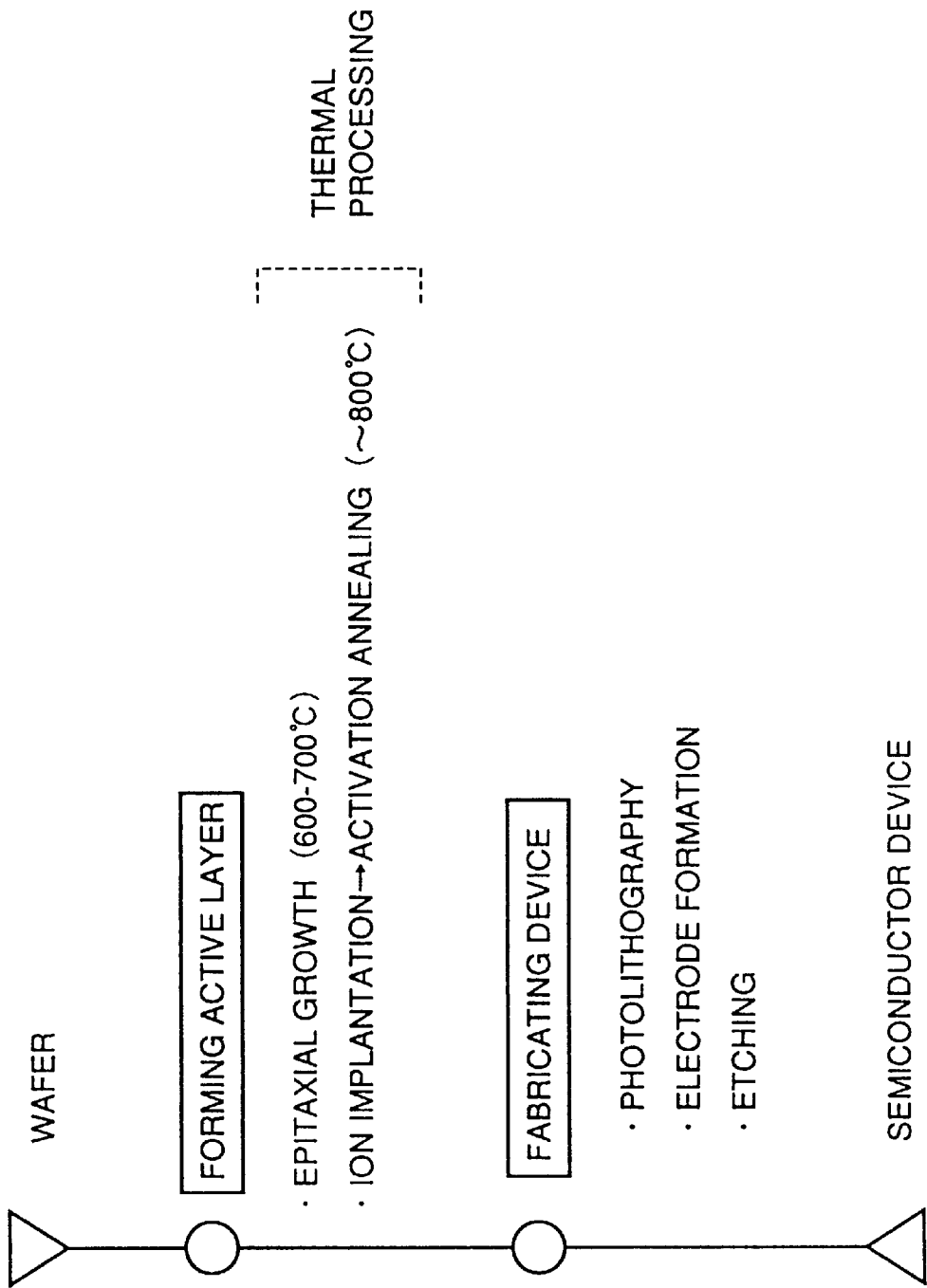
FIG. 1 shows steps of manufacturing a semiconductor device.

It is certified that error appears in the above-identified patent and that said Letters Patent is hereby corrected as shown below:

In FIG. 1 of the drawings, replace Fig. 1 by:

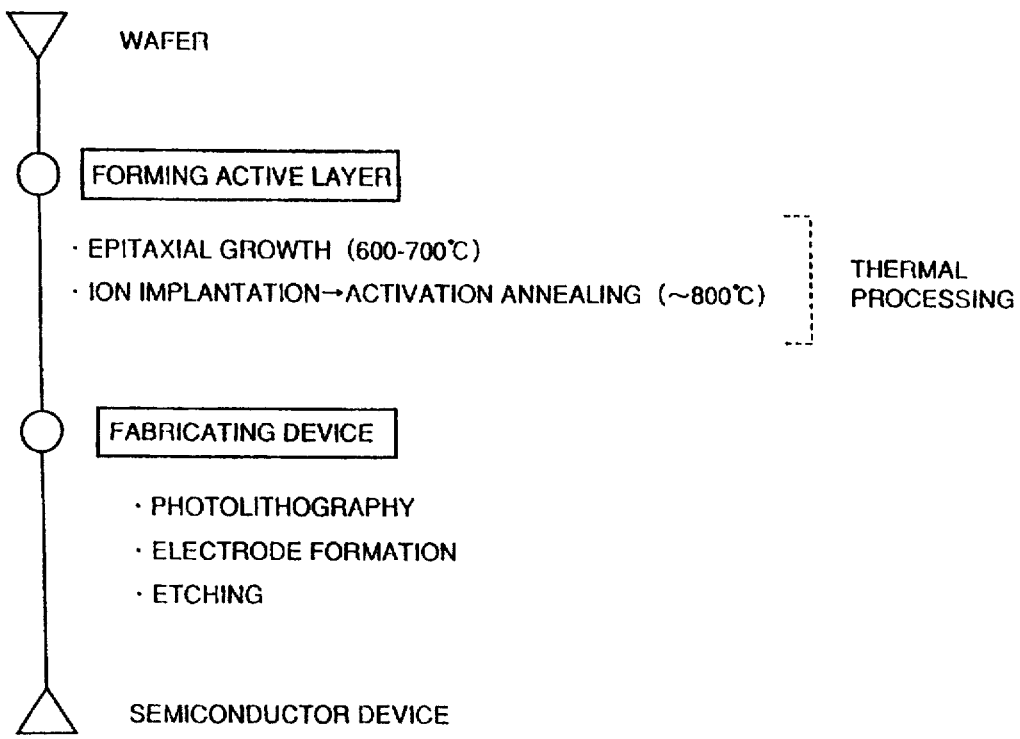

UNITED STATES PATENT AND TRADEMARK OFFICE
CERTIFICATE OF CORRECTION

PATENT NO. : 5,985,678  
DATED : November 16, 1999  
INVENTOR(S) : Makoto Kiyama Page 2 of 4

Figure 2:
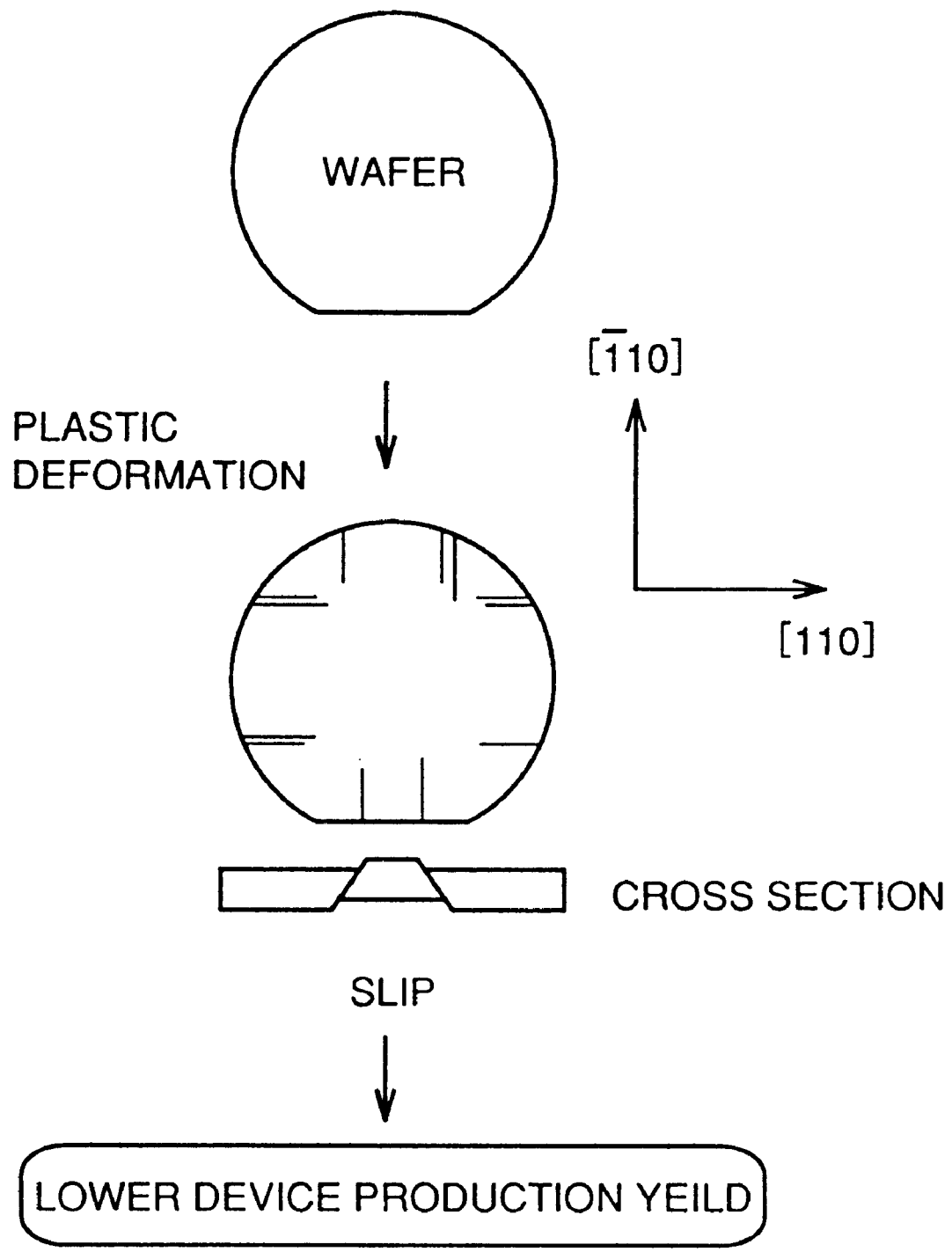
FIG. 2 shows steps related to generation of slips.

It is certified that error appears in the above-identified patent and that said Letters Patent is hereby corrected as shown below:

In FIG. 2 of the drawings, replace Fig. 2 by:

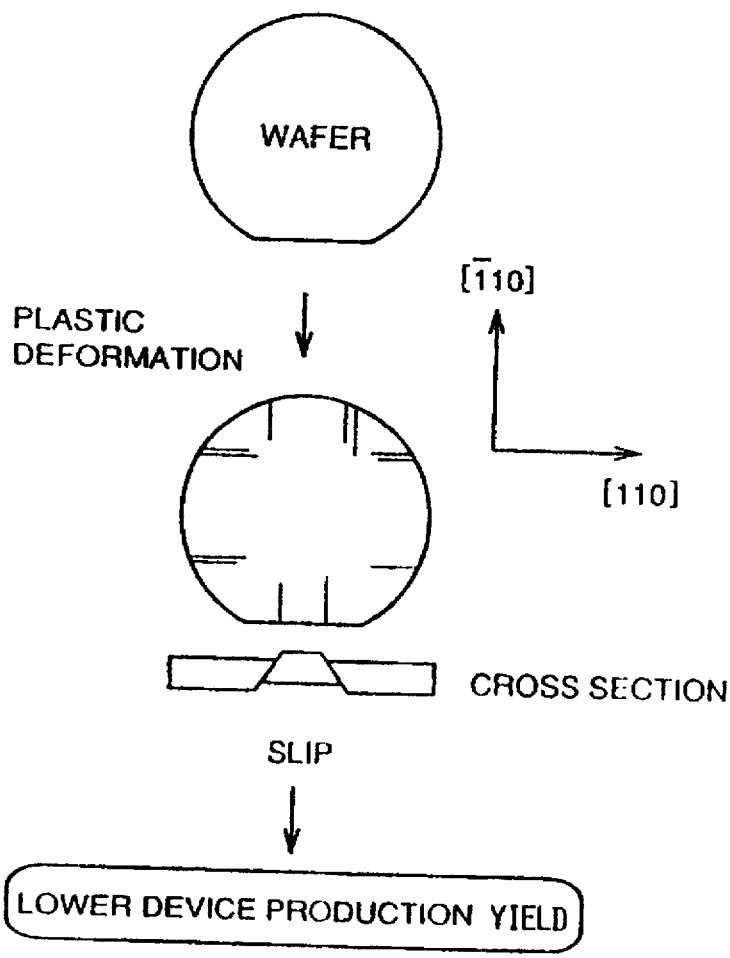

UNITED STATES PATENT AND TRADEMARK OFFICE
CERTIFICATE OF CORRECTION

PATENT NO. : 5,985,678
DATED : November 16, 1999
INVENTOR(S) : Makoto Kiyama

It is certified that error appears in the above-identified patent and that said Letters Patent is hereby corrected as shown below:

In FIG. 5 of the drawings, replace Fig. 5 by:

FIG. 5

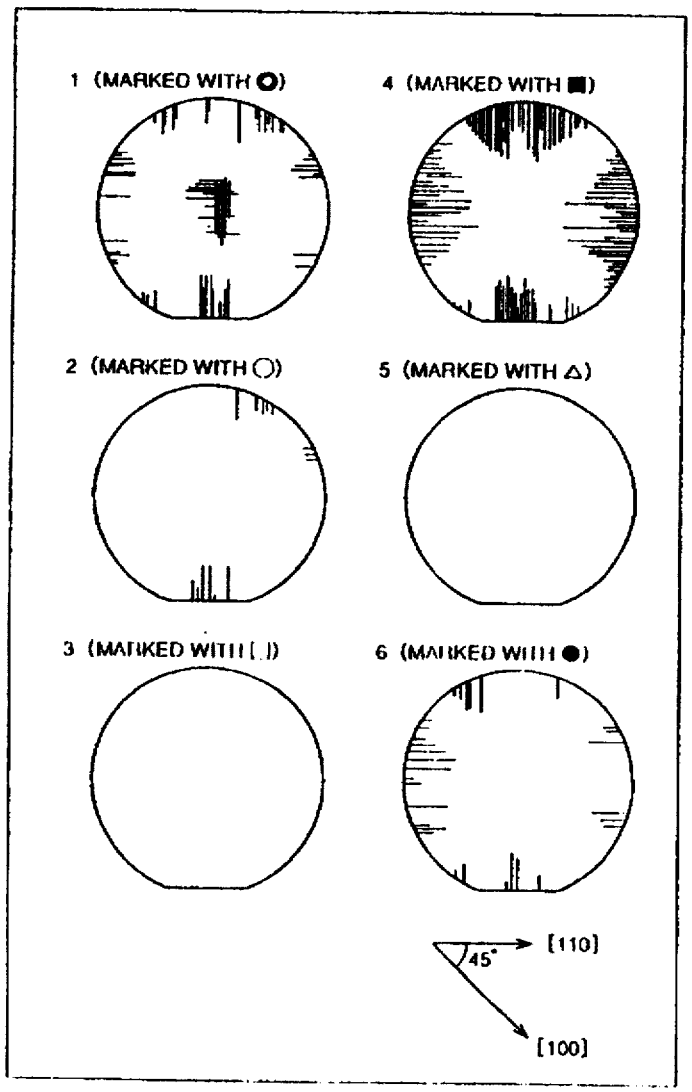

UNITED STATES PATENT AND TRADEMARK OFFICE
CERTIFICATE OF CORRECTION

PATENT NO. : 5,985,678
DATED : November 16, 1999
INVENTOR(S) : Makoto Kiyama

It is certified that error appears in the above-identified patent and that said Letters Patent is hereby corrected as shown below:

Column 1:
Line 52, after "wafer" insert --is--;
Line 62, after "formation" delete "breed";

Column 2:
Line 26, after "during" replace "increased" by --increase--;
Line 27, before "of" replace "decreased" by --decrease--;

Column 3:
Line 45, replace the line to read --thereof is used as the wafer in this method--;

Column 4:
Line 63, after "wafer" delete ","; after "examples" insert --,--;

Column 5:
Line 10, after "distributions" insert --)--;
Line 17, after "distributions" insert --)--;

Column 8:
Line 44, before "distributions" delete "the";

Column 9:
Line 35, before "Sr-sθ|" insert --|--;

Signed and Sealed this

Seventh Day of August, 2001

*Attest:*

NICHOLAS P. GODICI
*Attesting Officer*     *Acting Director of the United States Patent and Trademark Office*

UNITED STATES PATENT AND TRADEMARK OFFICE
CERTIFICATE OF CORRECTION

PATENT NO.    : 5,985,678
DATED         : November 16, 1999
INVENTOR(S)   : Makoto Kiyama It is certified that error appears in the above-identified patent and that said Letters Patent is hereby corrected as shown below:

Drawings,
Replace Fig. 1 by:

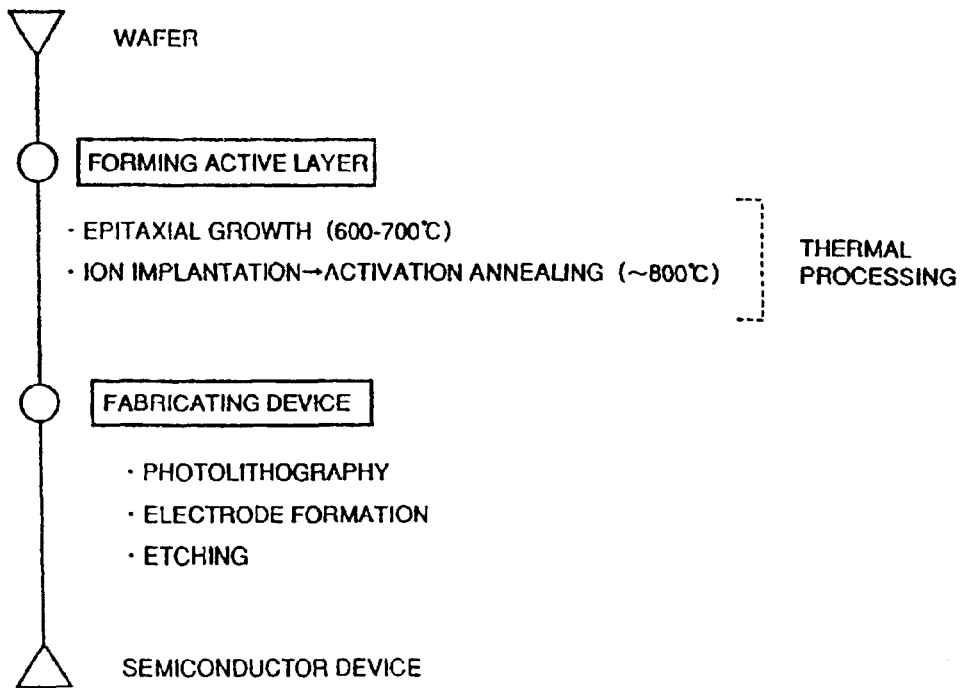

UNITED STATES PATENT AND TRADEMARK OFFICE
CERTIFICATE OF CORRECTION

PATENT NO.    : 5,985,678
DATED         : November 16, 1999
INVENTOR(S)   : Makoto Kiyama It is certified that error appears in the above-identified patent and that said Letters Patent is hereby corrected as shown below:

Drawings,
Replace Fig. 2 by:

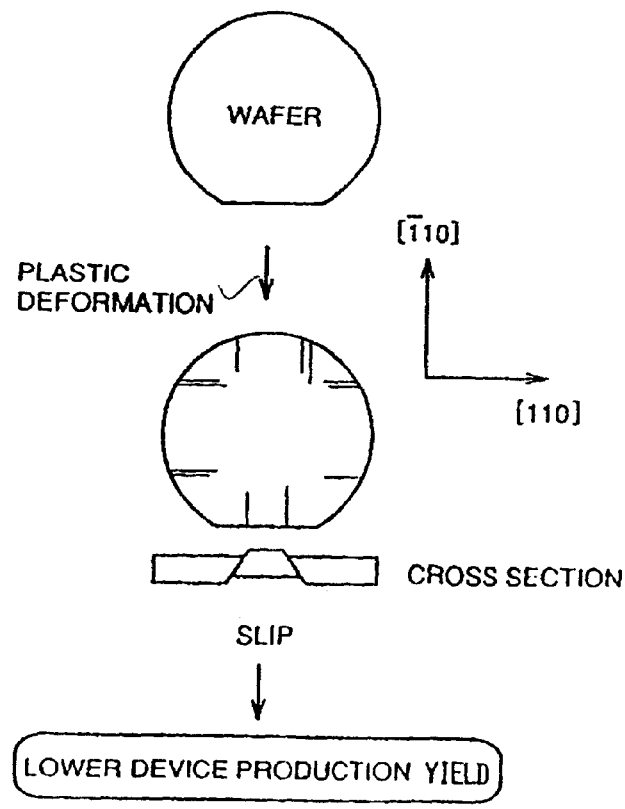

UNITED STATES PATENT AND TRADEMARK OFFICE
CERTIFICATE OF CORRECTION

PATENT NO.   : 5,985,678
DATED        : November 16, 1999
INVENTOR(S)  : Makoto Kiyama It is certified that error appears in the above-identified patent and that said Letters Patent is hereby corrected as shown below:

Drawings,
Replace Fig. 5 by:

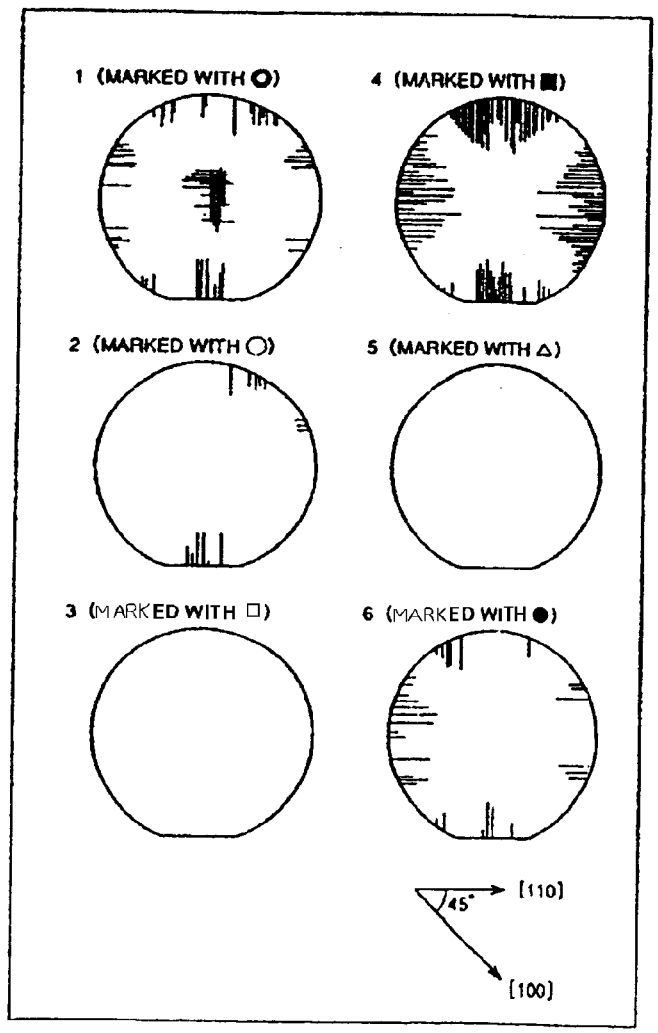

UNITED STATES PATENT AND TRADEMARK OFFICE
CERTIFICATE OF CORRECTION

PATENT NO. : 5,985,678
DATED : November 16, 1999
INVENTOR(S) : Makoto Kiyama

It is certified that error appears in the above-identified patent and that said Letters Patent is hereby corrected as shown below:

Column 1,
Line 52, after "wafer" insert -- is --;
Line 62, after "formation" delete "breed";

Column 2,
Line 26, after "during" replace "increased" by -- increase --;
Line 27, before "of" replace "decreased" by -- decrease --;

Column 3,
Line 45, replace the line to read -- thereof is used as the wafer in this method --;

Column 4,
Line 63, after "wafer" delete ","; after "examples" insert -- , --;

Column 5,
Line 10, after "distributions" insert -- ) --;
Line 17, after "distributions" insert -- ) --;

Column 8,
Line 44, before "distribution" delete "the";

Column 9,
Line 35, before "Sr-sθ|" insert -- | --;

Signed and Sealed this

Third Day of September, 2002

*Attest:*

*Attesting Officer*

JAMES E. ROGAN
*Director of the United States Patent and Trademark Office*